United States Patent
Long et al.

(10) Patent No.: US 9,014,278 B2
(45) Date of Patent: Apr. 21, 2015

(54) FOR ERROR CORRECTION IN DISTRIBUTED VIDEO CODING

(75) Inventors: Timothy Merrick Long, Lindfield (AU); Axel Lakus-Becker, Artarmon (AU); Ka-Ming Leung, Marsfield (AU)

(73) Assignee: Canon Kabushiki Kaisha, Tokyo (JP)

( * ) Notice: Subject to any disclaimer, the term of this patent is extended or adjusted under 35 U.S.C. 154(b) by 497 days.

(21) Appl. No.: 12/680,271

(22) PCT Filed: Oct. 8, 2008

(86) PCT No.: PCT/AU2008/001489
§ 371 (c)(1),
(2), (4) Date: Jul. 19, 2010

(87) PCT Pub. No.: WO2009/070826
PCT Pub. Date: Jun. 11, 2009

(65) Prior Publication Data
US 2010/0316137 A1    Dec. 16, 2010

(30) Foreign Application Priority Data
Dec. 3, 2007 (AU) .................................. 2007237313

(51) Int. Cl.
H04N 7/64 (2006.01)
H03M 13/29 (2006.01)
H04N 19/59 (2014.01)
H04N 19/30 (2014.01)

(52) U.S. Cl.
CPC ........... *H03M 13/2957* (2013.01); *H04N 19/59* (2014.11); *H04N 19/395* (2014.11)

(58) Field of Classification Search
CPC ...................................................... H04N 7/64

USPC ...................................................... 375/240.27
See application file for complete search history.

(56) References Cited

U.S. PATENT DOCUMENTS

| | | | |
|---|---|---|---|
| 4,737,863 A * | 4/1988 | Eto et al. | 386/300 |
| 4,901,075 A * | 2/1990 | Vogel | 341/63 |
| 5,768,424 A | 6/1998 | Long | 382/232 |
| 6,201,485 B1 * | 3/2001 | McEwen et al. | 341/59 |
| 6,215,831 B1 * | 4/2001 | Nowack et al. | 375/340 |
| 6,259,384 B1 * | 7/2001 | McEwen et al. | 341/59 |
| 6,417,788 B1 * | 7/2002 | McEwen et al. | 341/59 |
| 6,421,387 B1 * | 7/2002 | Rhee | 375/240.27 |
| 6,466,624 B1 * | 10/2002 | Fogg | 375/240.27 |
| 6,493,842 B1 * | 12/2002 | Kondo et al. | 714/752 |
| 6,614,847 B1 * | 9/2003 | Das et al. | 375/240.16 |
| 6,654,544 B1 * | 11/2003 | Suzuki et al. | 386/329 |
| 6,664,902 B2 | 12/2003 | Andrew et al. | 341/50 |
| 6,823,002 B1 * | 11/2004 | Betts | 375/219 |

(Continued)

FOREIGN PATENT DOCUMENTS

WO    WO 2009073919 A1 *    6/2009    ............... H04N 7/66

*Primary Examiner* — Sath V Perungavoor
*Assistant Examiner* — Kehinde O Abimbola
(74) *Attorney, Agent, or Firm* — Fitzpatrick, Cella, Harper & Scinto

(57) ABSTRACT

A method (800) of performing distributed video encoding on an input video frame (1005), is disclosed. The method (800) forms a bit-stream from original pixel values of the input video frame (1005), such that groups of bits in the bit-stream are associated with clusters of spatial pixel positions in the input video frame (1005). The bit-stream is interleaved to reduce the clustering. The interleaved bit-stream is encoded to generate parity bits from the bit-stream according to a bitwise error correction method.

11 Claims, 8 Drawing Sheets

(56) References Cited

U.S. PATENT DOCUMENTS

| | | | |
|---|---|---|---|
| 6,850,568 B1* | 2/2005 | Williams et al. | 375/240.16 |
| 6,876,705 B2* | 4/2005 | Katsavounidis et al. | 375/240.28 |
| 6,968,091 B2* | 11/2005 | Faibish et al. | 382/251 |
| 7,003,712 B2* | 2/2006 | Martinian et al. | 714/761 |
| 7,020,828 B2* | 3/2006 | Birru | 714/792 |
| 7,058,965 B1* | 6/2006 | Gordon et al. | 725/39 |
| 7,072,568 B2* | 7/2006 | Sugiyama et al. | 386/329 |
| 7,269,775 B2* | 9/2007 | Pendakur et al. | 714/748 |
| 7,363,569 B2* | 4/2008 | Pendakur et al. | 714/748 |
| 7,388,521 B2* | 6/2008 | Lu et al. | 341/51 |
| 7,509,553 B2* | 3/2009 | Fuldseth et al. | 714/747 |
| 7,533,324 B2* | 5/2009 | Fischer et al. | 714/776 |
| 7,644,348 B2* | 1/2010 | Longwell et al. | 714/800 |
| 7,646,813 B2* | 1/2010 | De With et al. | 375/240.2 |
| 7,711,839 B2* | 5/2010 | Bordes et al. | 709/231 |
| 7,945,103 B2* | 5/2011 | Spampinato | 382/233 |
| 7,991,055 B2* | 8/2011 | Cancemi et al. | 375/240.27 |
| 7,991,237 B2* | 8/2011 | Sekiguchi et al. | 382/233 |
| 8,111,755 B2* | 2/2012 | He et al. | 375/240.23 |
| 8,121,425 B2* | 2/2012 | Choi et al. | 382/238 |
| 8,126,046 B2* | 2/2012 | Chiu et al. | 375/240.01 |
| 8,139,875 B2* | 3/2012 | Sekiguchi et al. | 382/233 |
| 8,189,682 B2* | 5/2012 | Yamasaki | 375/240.25 |
| 8,208,549 B2* | 6/2012 | Sasai et al. | 375/240.16 |
| 8,355,588 B2* | 1/2013 | Abe et al. | 382/236 |
| 2002/0054644 A1* | 5/2002 | Henry et al. | 375/240.27 |
| 2002/0146074 A1* | 10/2002 | Ariel et al. | 375/240.27 |
| 2002/0157058 A1* | 10/2002 | Ariel et al. | 714/774 |
| 2002/0181590 A1* | 12/2002 | Bellers | 375/240.16 |
| 2003/0012287 A1* | 1/2003 | Katsavounidis et al. | 375/240.27 |
| 2003/0099303 A1* | 5/2003 | Birru et al. | 375/265 |
| 2003/0123557 A1* | 7/2003 | De With et al. | 375/240.27 |
| 2004/0047433 A1 | 3/2004 | Mogre et al. | 375/308 |
| 2004/0258151 A1* | 12/2004 | Spampinato | 375/240.03 |
| 2005/0207497 A1* | 9/2005 | Rovati et al. | 375/240.16 |
| 2005/0248473 A1* | 11/2005 | Kukla et al. | 341/50 |
| 2005/0254584 A1* | 11/2005 | Kim et al. | 375/240.27 |
| 2007/0127570 A1 | 6/2007 | Juri | 375/240.12 |
| 2007/0189377 A1* | 8/2007 | Taylor et al. | 375/240 |
| 2007/0214403 A1* | 9/2007 | Longwell et al. | 714/800 |
| 2007/0223579 A1* | 9/2007 | Bao | 375/240.12 |
| 2007/0223580 A1* | 9/2007 | Ye et al. | 375/240.12 |
| 2008/0031344 A1* | 2/2008 | Lu et al. | 375/240.19 |
| 2008/0055124 A1* | 3/2008 | Lakus-Becker | 341/81 |
| 2008/0069242 A1* | 3/2008 | Xu et al. | 375/240.24 |
| 2008/0117975 A1* | 5/2008 | Sasai et al. | 375/240.16 |
| 2008/0165853 A1* | 7/2008 | He et al. | 375/240.16 |
| 2008/0291065 A1* | 11/2008 | Lu et al. | 341/107 |
| 2009/0103606 A1* | 4/2009 | Lu et al. | 375/240.02 |
| 2009/0323798 A1* | 12/2009 | He et al. | 375/240.01 |
| 2010/0034290 A1* | 2/2010 | Lakus-Becker | 375/240.25 |
| 2010/0049867 A1* | 2/2010 | Panwar et al. | 709/231 |
| 2010/0142620 A1* | 6/2010 | Lee et al. | 375/240.16 |
| 2010/0166064 A1* | 7/2010 | Perlman et al. | 375/240.07 |
| 2010/0208797 A1* | 8/2010 | Kang et al. | 375/240.03 |
| 2010/0220787 A1* | 9/2010 | Yamasaki | 375/240.16 |
| 2010/0241924 A1* | 9/2010 | Nishi | 714/758 |
| 2010/0316137 A1* | 12/2010 | Long et al. | 375/240.27 |
| 2010/0322312 A1* | 12/2010 | Boisson et al. | 375/240.13 |
| 2011/0075726 A1* | 3/2011 | Yamasaki | 375/240.02 |
| 2011/0154149 A1* | 6/2011 | Jeon et al. | 714/752 |
| 2011/0258522 A1* | 10/2011 | Sakomizu et al. | 714/790 |
| 2012/0114049 A1* | 5/2012 | Hannuksela et al. | 375/240.27 |

* cited by examiner

FOR ERROR CORRECTION IN DISTRIBUTED VIDEO CODING

FIELD OF THE INVENTION

The present invention relates generally to video encoding and decoding and, in particular, to a method and apparatus for performing distributed video encoding.

BACKGROUND

Various products, such as digital cameras and digital video cameras, are used to capture images and video. These products contain an image sensing device, such as a charge coupled device (CCD), which is used to capture light energy focussed on the image sensing device. The captured light energy, which is indicative of a scene, is then processed to form a digital image. Various formats are used to represent such digital images, or videos. Formats used to represent video include Motion JPEG, MPEG2, MPEG4 and H.264.

All the formats listed above are compression formats. While those formats offer high quality and improve the number of video frames that can be stored on a given media, they typically suffer because of their long encoding runtime.

A complex encoder requires complex hardware. Complex encoding hardware in turn is disadvantageous in terms of design cost, manufacturing cost and physical size of the encoding hardware. Furthermore, long encoding runtime delays the rate at which video frames can be captured while not overflowing a temporary buffer. Additionally, more complex encoding hardware has higher battery consumption. As battery life is essential for a mobile device, it is desirable that battery consumption be minimized in mobile devices.

To minimize the complexity of an encoder, Wyner Ziv coding, or "distributed video coding", may be used. In distributed video coding the complexity of the encoder is shifted to the decoder. The input video stream is also usually split into key frames and non-key frames. The key frames are compressed using a conventional coding scheme, such as Motion JPEG, MPEG2, MPEG4 or H.264, and the decoder conventionally decodes the key frames. With the help of the key frames the non-key frames are predicted. The processing at the decoder is thus equivalent to carrying out motion estimation which is usually performed at the encoder. The predicted non-key frames are improved in terms of visual quality with the information the encoder is providing for the non-key frames.

The visual quality of the decoded video stream depends heavily on the quality of the prediction of the non-key frames and the level of quantization to the image pixel values. The prediction is often a rough estimate of the original frame, generated from adjacent frames, e.g., through motion estimation and interpolation. Thus when there is a mismatch between the prediction and the decoded values, some forms of compromise are required to resolve the differences.

Distributed video coding may be used to correct both prediction errors and error correction mistakes. Conventionally, a frame re-construction function after Wyner-Ziv decoding has been used to correct such errors. If the predicted value is within a range of the decoded quantized symbol, the reconstructed pixel value is made equal to the predicted value. Otherwise the re-construction value is set to equal the upper bound or the lower bound of the quantized symbol, depending on the magnitude of the predicted value. Such a method minimizes decoding errors and eliminates large positive or negative errors which are highly perceptible to human eyes. However, the minimization is considered sub-optimal.

SUMMARY

It is an object of the present invention to substantially overcome, or at least ameliorate, one or more disadvantages of existing arrangements.

According to one aspect of the present invention there is provided a method of performing distributed video encoding on an input video frame, said method comprising the steps of:

forming a bit-stream from original pixel values of the input video frame, such that groups of bits in the bit-stream are associated with clusters of spatial pixel positions in the input video frame;

interleaving the bit-stream to reduce said clustering; and encoding the interleaved bit-stream to generate parity bits from the bit-stream according to a bitwise error correction method.

According to another aspect of the present invention there is provided a method of decoding a compressed video frame, said method comprising the steps of:

up-sampling the compressed video frame;

interleaving the up-sampled video frame to determine an interleaved bit-stream;

determining a further bit-stream from the interleaved bit-stream using parity information associated with the compressed video frame; and de-interleaving pixel values determined for the further bit-stream to determine a decoded version of the compressed video frame.

According to still another aspect of the present invention there is provided an apparatus for performing distributed video encoding on an input video frame, said apparatus comprising:

forming means for forming a bit-stream from original pixel values of the input video frame, such that groups of bits in the bit-stream are associated with clusters of spatial pixel positions in the input video frame;

interleaver for interleaving the bit-stream to reduce said clustering; and encoder for encoding the interleaved bit-stream to generate parity bits from the bit-stream according to a bitwise error correction method.

According to still another aspect of the present invention there is provided an apparatus for decoding a compressed video frame, said apparatus comprising:

up-sampler for up-sampling the compressed video frame;

interleaver for interleaving the up-sampled video frame to determine an interleaved bit-stream;

determining means for determining a further bit-stream from the interleaved bit-stream using parity information associated with the compressed video frame; and de-interleaver for de-interleaving pixel values determined for the further bit-stream to determine a decoded version of the compressed video frame.

According to still another aspect of the present invention there is provided a computer program product having a computer readable medium having a computer program recorded therein for performing distributed video encoding on an input video frame, said computer program product comprising:

code for forming a bit-stream from original pixel values of the input video frame, such that groups of bits in the bit-stream are associated with clusters of spatial pixel positions in the input video frame;

code for interleaving the bit-stream to reduce said clustering; and code for encoding the interleaved bit-stream to generate parity bits from the bit-stream according to a bitwise error correction method.

According to still another aspect of the present invention there is provided a computer program product having a computer readable medium having a computer program recorded therein for decoding a compressed video frame, said program:

code for up-sampling the compressed video frame;
code for interleaving the up-sampled video frame to determine an interleaved bit-stream;
code for determining a further bit-stream from the interleaved bit-stream using parity to information associated with the compressed video frame; and
code for de-interleaving pixel values determined for the further bit-stream to determine a decoded version of the compressed video frame. Other aspects of the invention are also disclosed.

According to still another aspect of the present invention there is provided a system for performing distributed video encoding on an input video frame, said system comprising:

a memory for storing data and a computer program; and
a processor coupled to said memory executing said computer program, said computer program comprising instructions for:
forming a bit-stream from original pixel values of the input video frame, such that groups of bits in the bit-stream are associated with clusters of spatial pixel positions in the input video frame;
interleaving the bit-stream to reduce said clustering; and
encoding the interleaved bit-stream to generate parity bits from the bit-stream according to a bitwise error correction method.

According to still another aspect of the present invention there is provided a system for decoding a compressed video frame, said system comprising:

a memory for storing data and a computer program; and
a processor coupled to said memory executing said computer program, said computer program comprising instructions for:
up-sampling the compressed video frame;
interleaving the up-sampled video frame to determine an interleaved bit-stream;
determining a further bit-stream from the interleaved bit-stream using parity information associated with the compressed video frame; and
de-interleaving pixel values determined for the further bit-stream to determine a decoded version of the compressed video frame.

BRIEF DESCRIPTION OF THE DRAWINGS

One or more embodiments of the present invention will now be described with reference to the drawings, in which.

DETAILED DESCRIPTION

Figure 1:
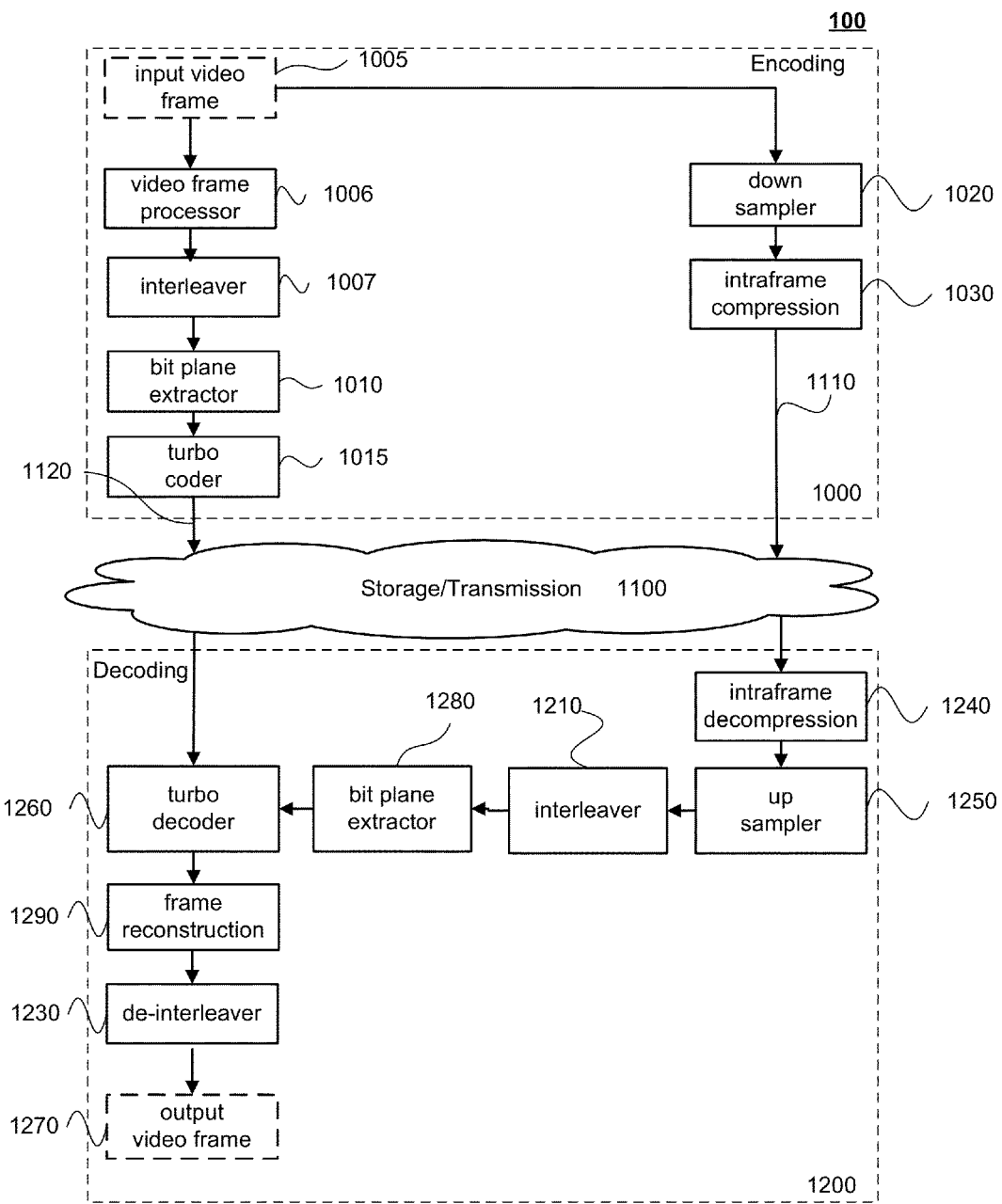
FIG. 1 shows a schematic block diagram of a system for encoding an input video, for transmitting or storing the encoded video, and for decoding the video.

Where reference is made in any one or more of the accompanying drawings to steps and/or features, which have the same reference numerals, those steps and/or features have for the purposes of this description the same function(s) or operation(s), unless the contrary intention appears.

FIG. 1 shows a schematic block diagram of a system 100 for performing distributed video encoding an input video, for transmitting or storing the encoded video and for decoding the video, according to an exemplary embodiment. The system 100 includes an encoder 1000 and a decoder 1200 interconnected through a storage or transmission medium 1100. The encoder 1000 forms two independently encoded bit-streams 1110 and 1120, which are jointly decoded by the decoder 1200.

Figure 4:
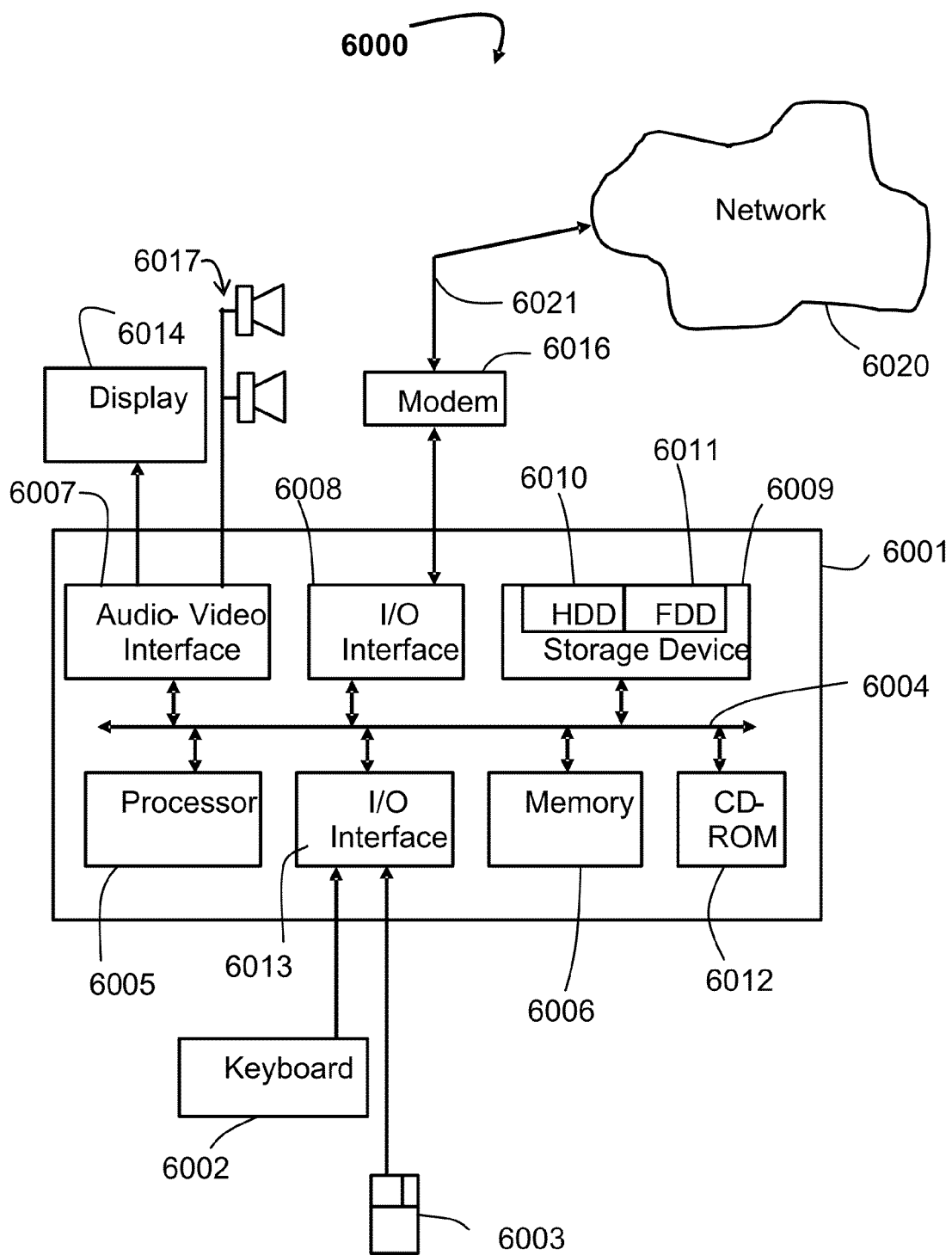
FIG. 4 shows a schematic block diagram of a computer system in which the system shown in FIG. 1 may be implemented.

The components 1000, 1100 and 1200 of the system 100 shown in FIG. 1 may be implemented using a computer system 6000, such as that shown in FIG. 4, wherein the encoder 1000 and decoder 1200 may be implemented as software, such as one or more application programs executable within the computer system 6000. As described below, the encoder 1000 comprises a plurality of software modules 1005, 1006, 1007, 1010, 1015, 1020 and 1030, each performing specific functions. Similarly, the decoder 1200 comprises a plurality of other software modules 1210, 1230, 1240, 1250, 1260, 1270 and 1280, each performing specific functions.

The software modules may be stored in a computer readable medium, including the storage devices described below, for example. The software modules may be loaded into the computer system 6000 from the computer readable medium, and then executed by the computer system 6000. A computer readable medium having such software or computer program recorded on it is a computer program product. The use of the computer program product in the computer system 6000 preferably effects an advantageous apparatus for implementing the described methods.

As seen in FIG. 4, the computer system 6000 is formed by a computer module 6001, input devices such as a keyboard 6002 and a mouse pointer device 6003, and output devices including a display device 6014 and loudspeakers 6017. An external Modulator-Demodulator (Modem) transceiver device 6016 may be used by the computer module 6001 for communicating to and from a communications network 6020 via a connection 6021.

The computer module 6001 typically includes at least one processor unit 6005, and a memory unit 6006. The module 6001 also includes a number of input/output (I/O) interfaces including an audio-video interface 6007 that couples to the video display 6014 and loudspeakers 6017, an I/O interface 6013 for the keyboard 6002 and mouse 6003, and an interface 6008 for the external modem 6016. In some implementations, the modem 6016 may be incorporated within the computer module 6001, for example within the interface 6008. A storage device 6009 is provided and typically includes a hard disk drive 6010 and a floppy disk drive 6011. A CD-ROM drive 6012 is typically provided as a non-volatile source of data.

The components 6005 to 6013 of the computer module 6001 typically communicate via an interconnected bus 6004 and in a manner which results in a conventional mode of operation of the computer system 6000 known to those in the relevant art.

Typically, the application programs discussed above are resident on the hard disk drive 6010 and are read and controlled in execution by the processor 6005. Intermediate storage of such programs and any data fetched from the network 6020 may be accomplished using the semiconductor memory 6006, possibly in concert with the hard disk drive 6010. In some instances, the application programs may be supplied to the user encoded on one or more CD-ROM and read via the corresponding drive 6012, or alternatively may be read by the user from the network 6020. Still further, the software can also be loaded into the computer system 6000 from other computer readable media. Computer readable media refers to any storage medium that participates in providing instructions and/or data to the computer system 6000 for execution and/or processing.

The system 100 shown in FIG. 1 may alternatively be implemented in dedicated hardware such as one or more integrated circuits. Such dedicated hardware may include graphic processors, digital signal processors, or one or more microprocessors and associated memories.

In one implementation, the encoder 1000 and decoder 1200 are implemented within a camera (not illustrated), wherein the encoder 1000 and the decoder 1200 may be implemented as software being executed by a processor of the camera, or may implemented using hardware within the camera.

In a second implementation, only the encoder 1000 is implemented within a camera, wherein the encoder 1000 may be implemented as software executing in a processor of the camera, or implemented using hardware within the camera.

Referring again to FIG. 1, a video frame 1005 is received as input to system 100. Preferably every input video frame 1005 is processed by the system 100. In an alternative embodiment only every fifth input video frame is encoded using the system 100. In yet another alternative embodiment, a selection of input video frames 1005 is made from the input video, with the selection of the input video frame 1005 depending on the video content. For example, if an occlusion of an object represented in the input video is observed, and if the extent of the observed occlusion is found to be above a threshold, then the input video frame 1005 is encoded using the system 100.

Figure 7:
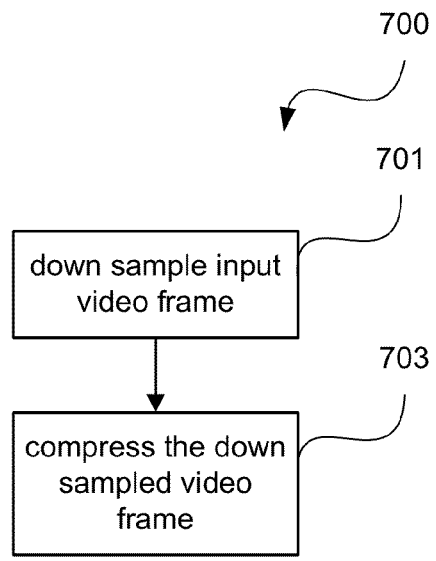
FIG. 7 is a flow diagram showing a method of compressing the input video frame.

The encoder 1000 compresses the input video frame 1005 to form a bit-stream 1110 as seen in FIG. 1. A method 700 of compressing the input video frame 1005 will now be described with reference to FIGS. 1 and 7. The method 700 may be implemented as software in the form of a down-sampler module 1020 and an intra-frame compression module 1030. The software is preferably resident on the hard disk drive 6010 and is controlled in its execution by the processor 6005.

The method 700 begins at step 701, where the encoder 1000, executed by the processor 6005, performs the step of down sampling the input video frame 1005 using the down-sampler module 1020 to form a down sampled version of the input video frame 1005. The down sampled version of the input video frame may be stored in the memory 6006 and/or the storage device 6009. At the next step 703, the encoder 1000, executed by the processor 6005, performs the step of compressing the down sampled version of the input video frame 1005 using the intra-frame compression module 1030 to form the bit-stream 1110. This bit-stream 1110 is transmitted over, or stored in, the storage or transmission medium 1100 for decompression by the decoder 1200. The bit-stream 1110 may also be stored in the memory 6006 and/or the storage device 6009.

In the exemplary embodiment, the down-sampler module 1020 comprises a down sampling filter with a cubic kernel. The down-sampler module 1020 performs the down sampling at a down sampling rate of two, meaning that the resolution is reduced to one half of the original resolution in both the horizontal and vertical dimensions. A different down sampling rate may be defined by a user. Alternative down sampling methods may be employed by the down-sampler module 1020, such as nearest neighbour, bilinear, bi-cubic, and quadratic down sampling filters using various kernels such as Gaussian, Bessel, Hamming, Mitchell or Blackman kernels.

The compression method used by the intra-frame compression module 1030 may be baseline mode JPEG compression, compression according to the JPEG2000 standard, or compression according to the H.264 standard.

Independently from the down sampling in the down-sampler module 1020 and the compression in the intra-frame compression module 1030, parts of the selected input video frame 1005 are encoded to form a bit-stream 1120. The bit-stream 1120 may be stored in the memory 6006 and/or the storage device 6009.

A method 800 of encoding the input video frame 1005 to form the bit-stream 1120 will now be described with reference to FIGS. 1 and 8. The method 800 may be implemented as software in the form of a video frame processor module 1006, an interleaver module 1007, a bit plane extractor module 1010 and a turbo coder module 1015. The software is preferably resident on the hard disk drive 6010 and is controlled in its execution by the processor 6005.

Figure 8:
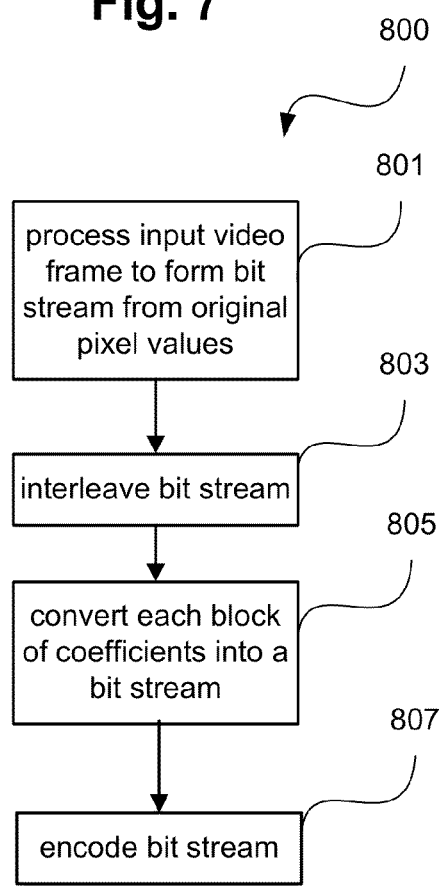
FIG. 8 is a flow diagram showing a method of encoding the input video frame.

As seen in FIGS. 1 and 8, the method 800 begins at the first step 801, where the input video frame 1005 is firstly processed by the video frame processor module 1006, executed by the processor 6005, to form a bit-stream from original pixel values of the input video frame 1005, such that groups of bits in the bit-stream are associated with clusters of spatial pixel positions in the input video frame 1005. The video frame processor module 1006 may partition the original pixels of the input video frame 1005 into one or more blocks of pixels. The pixels of each block of pixels may then be scanned by the video frame processor module 1006 in an order representing spatial positions of the pixels in the block. For example, the pixels of each block may be scanned 'scanline by scanline', 'column by column' or in a 'raster scan order' (i.e., in a zig-zag order) from the top to the bottom of the block of pixels. The video frame processor module 1006 produces a bit-stream which is highly correlated with the original pixels of the input video frame 1005. The bit-stream produced by the video frame processor module 1006 may be stored in the memory 6006 and/or the storage device 6009.

The bit-stream formed by the video frame processor module 1006 is then input to the interleaver module 1007 which performs the step of interleaving the bit-stream at the next step 803 in order to reduce the clustering in the bit-stream. As will be described in detail below, the interleaver module 1007, executed by the processor 6005, re-arranges the pixel positions for the video frame 1005 represented by the bit-stream output from the video frame processor module 1006 to reduce spatial correlation between adjacent pixels. The interleaver module 1007 then outputs an interleaved bit-stream which may be stored in the memory 6006 and/or the storage device 6009.

The interleaved bit-stream is input to a bit plane extractor module 1010 where, at the next step 805, each block of coefficients is converted into a bit-stream. The processor 6005 executes the bit plane extractor module 1010 to perform the step of forming a bit-stream for each block of coefficients of the interleaved bit-stream. Preferably, scanning starts on the most significant bit plane of the video frame 1005 and the most significant bits of the coefficients of the frame 1005 are concatenated to form a bit-stream containing the most significant bits. In a second pass, the scanning concatenates the second most significant bits of all coefficients of the frame 1005. The bits from the second scanning path are appended to the bit-stream generated in the previous scanning path. The scanning and appending continues in this manner until the least significant bit plane is completed. This generates one bit-stream for each input video frame 1005. In the exemplary embodiment, the bit plane extractor module 1010 scans the input video frame 1005 in a raster scan order wherein each pixel is processed. In an alternative embodiment, the scanning path may be similar to the scanning path employed in the JPEG 2000 standard.

In yet another alternative embodiment, not every pixel is processed. In this instance, the bit plane extractor module 1010, executed by the processor 6005, is configured to extract a specified subset of pixels within each bit plane to generate a bit-stream containing bits for spatial resolutions lower than the original resolution. The bit-stream generated by the bit plane extractor module 1010 may be stored in the memory 6006 and/or the storage device 6009.

At the next step 807, the bit-stream output from the bit plane extractor module 1010 is encoded in a turbo coder module 1015 to produce the bit-stream 1120 containing parity information. The turbo encoder module 1015, executed by the processor 6005, performs the step of encoding the interleaved bit-stream after processing by the bit plane extractor 1010 to generate parity bits from the bit-stream according to a bitwise error correction method. For each bit plane of the input video frame 1005, parity bits are generated. Accordingly, if the bit depth of the input video frame 1005 is eight, then eight sets of parity bits are produced of which each parity bit set refers to one bit plane only. The parity bits output by the turbo encoder 1015 are then transmitted over a storage or transmission medium 1100 in the bit-stream 1120.

Figure 2:
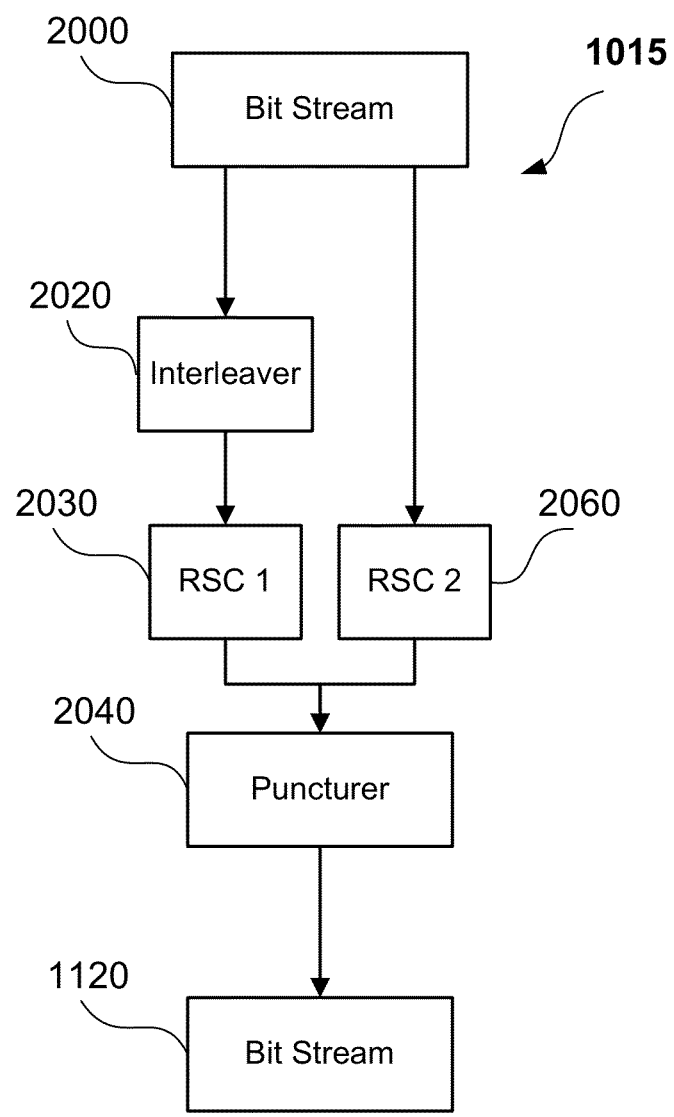
FIG. 2 shows a schematic block diagram of a turbo coder of the system of FIG. 1.

The operation of the turbo coder module 1015 is described in greater detail with reference to FIG. 2.

The encoder 1000 thus forms two bit-streams 1110 and 1120, both derived from the same input video frame 1005. The two bit-streams 1110 and 1120 from the intra-frame compression module 1030 and turbo coder module 1015 respectively may be multiplexed into a single bit-stream, which is then stored in, or transmitted over the storage or transmission medium 1100. The single bit-stream formed from the two bit-streams 1110 and 1120 may be stored in the memory 6006 and/or the storage devices 6009.

Having described an overview of the operation of the encoder 1000, an overview of the operation of the decoder 1200 is described below. The decoder 1200 receives the bit-stream 1120 from the turbo coder module 1015 the bit-stream 1110 from the intra-frame compression module 1030.

Figure 9:
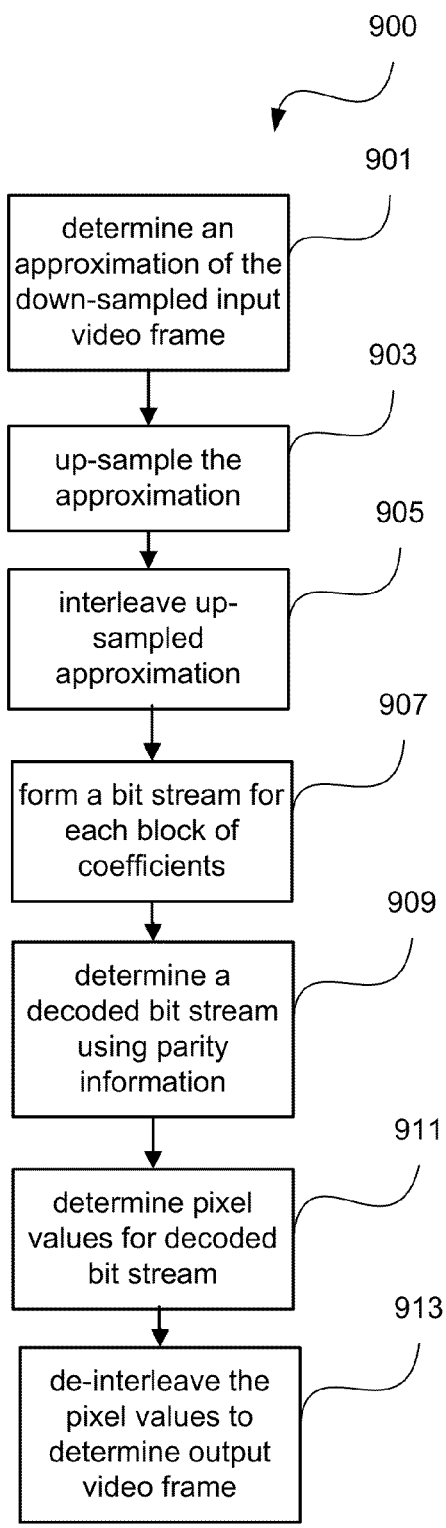
FIG. 9 is a flow diagram showing a method of decoding bit-streams to determine an output video frame representing a final approximation of an input video frame.

A method 900 of decoding the bit-streams 1120 and 1110 to determine an output video frame 1270 representing a final approximation of the input video frame 1005, will now be described with reference to FIG. 9. The method 900 may be implemented as software in the form of an intra-frame decompression module 1240, an up-sampler module 1250, an interleaver 1210, a bit plane extractor 1280, a turbo decoder 1260, a frame reconstruction module 1290 and a de-interleaver module 1230. The software is preferably resident on the hard disk drive 6010 and is controlled in its execution by the processor 6005.

The method 900 begins at the first step 901, where the bit-stream 1110 is processed by the intra-frame decompressor module 1240 executed by the processor 6005. The intra-frame decompressor module 1240 performs the inverse operation to the intra-frame compression module 1030. The intra-frame decompressor module 1240 performs the step of determining an approximation of the down sampled version of the input video frame. The approximation of the down sampled version of the input video frame may be stored in the memory 6006 and/or the storage device 6009.

At the next step 903, the up-sampler module 1250, executed by the processor 6005, performs the step of up-sampling the approximation of the down sampled version of the input video frame. Preferably a cubic filter is used during the up-sampling. The up-sampling method used by the up-sampler module 1250 does not have to be the inverse of the down sampling method used by the down-sampler module 1020. For example, a bilinear down sampling and a cubic up-sampling may be employed. The output from up-sampler module 1250 is an estimate of the input video frame 1005.

The method 900 continues at the next step 905 where the output from the up-sampler module 1250 is interleaved by the interleaver module 1210 which is substantially identical to the interleaver module 1007 of the encoder 1000. The interleaver module 1210 performs the step of interleaving the estimate of the input video frame 1005 output by the up-sampler 1250. In other embodiments, the encoder 1000 may select different methods to interleave the input video frame 1005 with the choice of the selection being transmitted to the decoder 1200. Transmitting the selection of the interleaving method to the decoder 1200 allows the interleaver module 1210 to interleave the output of the up-sampler module 1250 in the same way as performed by the interleaver module 1007 in the encoder 1000.

A bit-stream output from the interleaver module 1210 is then input to a bit plane extractor module 1280 which again is substantially identical to the bit plane extractor module 1010 of the encoder 1000. The bit plane extractor module 1280 performs the step of forming a bit-stream for each block of coefficients of the interleaved bit-stream output from the interleaver 1210. The output from the bit plane extractor module 1280 may be stored in a buffer configured within the memory 6006 and/or the storage device 6009.

The decoder 1200 further includes a turbo decoder module 1260, which is described in detail below with reference to FIG. 3. The turbo decoder module 1260 operates on each bit plane of the bit-stream 1120 in turn to correct at least a portion of that (current) bit plane. In a first iteration, the turbo decoder module 1260 receives the parity bits for the first (most significant) bit plane from bit-stream 1120 as input. The turbo decoder module 1260 also receives the first bit plane from the bit-stream output from the bit plane extractor module 1280 as side information. The turbo decoder module 1260 uses the parity bits (or parity information) for the first bit plane to improve the approximation (or determine a better approximation) of the first bit plane of the input video frame 1005. The turbo decoder module 1260 outputs a decoded bit-stream representing a decoded first bit plane. The decoded bit-stream may be stored in the memory 6006 and/or the storage device 6009. The above process repeats for lower bit planes until all bit planes are decoded. Accordingly, at step 909, the turbo decoder module 1260, executed by the processor 6005, performs the step of using the parity information to determine a decoded bit-stream representing a better approximation of the input video frame.

At the next step 911, the frame reconstruction module 1290 executed by the processor 6005 then processes the decoded bit-stream output by the turbo decoder module 1260 to determine pixel values for the decoded bit-stream. Accordingly, the frame reconstruction module 1290 performs the step of determining pixel values for the decoded bit-stream output by the turbo decoder module 1260. In the exemplary embodiment, the most significant bits of the coefficients of the frame 1005 are first determined by the turbo decoder 1260. The second most significant bits of the coefficients of the frame 1005 are then determined and concatenated with the first most significant bits of the coefficients of the frame 1005. This process repeats for lower bit planes until all bits are determined for each bit plane of the frame 1005. In other embodiments, the frame reconstruction module 1290 may use the output of the up-sampler 1250 and the information produced by the turbo decoder module 1260 to obtain the pixel values for the decoded bit-stream. The pixel values output from the frame reconstruction module 1290 are then de-interleaved by a de-interleaver module 1230. At step 913, the de-interleaver module 1230 performs the inverse operation to the interleaver module 1007 to generate the output video frame 1270. The output video frame 1270 is the final approximation of the input video frame 1005.

Having described the system 100 for encoding an input video to form the two independently encoded bit-streams 1120 and 1110, and jointly decoding the bit-streams to provide the output video frame 1270, components of those systems 100 are now described in more detail, starting with module 1007.

The interleaver module 1007 re-arranges the pixels in the input video frame 1005 before turbo encoding by the turbo encoder module 1120. As described above, the encoded bit-stream 1120 is then passed to the turbo decoder module 1260. The side information to the turbo decoder module 1260 is an up-sampled intra-frame represented by the bit-stream 1110. Lossy compression can often cause prediction errors to occur. The up-sampler 1250 may exaggerate any such errors, resulting in longer runs of bit errors in both horizontal and vertical directions, which are equivalent to error bursts in typical communication channels.

Figure 6A:
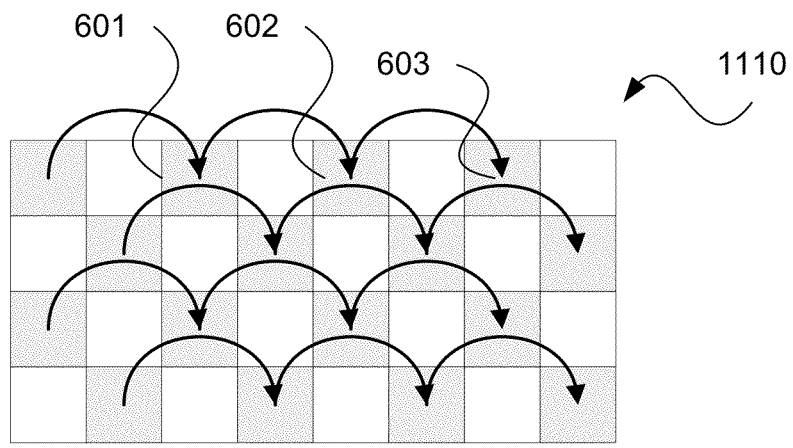
FIG. 6a shows pixels of a video frame being read horizontally from left to right, scanline by scanline.
Figure 6B:
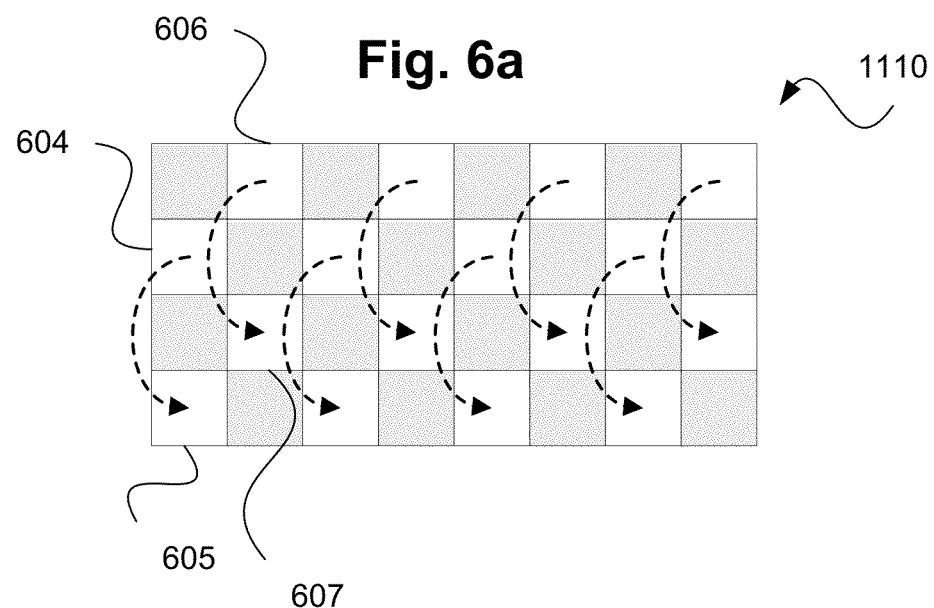
FIG. 6b shows the remaining pixels of the video frame of FIG. 6a being read in vertical order, column by column.

In order to improve the decoding performance of the system 100, in the exemplary embodiment, every second pixel (e.g., 601 to 603) of the bit-stream 1110 representing the up-sampled intra-frame is read horizontally by the interleaver module 1210, scanline by scanline, as shown in FIG. 6a. The remaining pixels (e.g., 604, 605, 606 and 607) of the intra-frame 1110 are then read in vertical order, column by column, as shown in FIG. 6b. The long horizontal runs of bit errors in the side information are thus shortened, improving the decoding performance of the system 100. The interleaver module 1210 therefore performs bitwise error correction.

In an alternative embodiment, the interleaver module 1007 may be a conventional interleaver. For example, the interleaver module 1007 may be a block interleaver, an arithmetic interleaver, an odd-even interleaver, or a pseudo-random interleaver. Using such a conventional interleaver allows spatially adjacent pixels to be separated further apart from each other significantly reducing error bursts in the side information.

In yet a further embodiment, the encoder 1000 may divide the input video frame 1005 into several fixed-sized or variable-sized frame segments. Each frame segment may be interleaved independently. Depending on the characteristics of the frame segment and the quality of the down-sampled intra-coded data of the bit-stream 1110 representing the intra-frame, an interleaving method which minimizes error bursts may be selected by the encoder 1000. Details of the interleaving method selected by the encoder 1000, together with other encoding parameters, are then encoded and transmitted to the decoder 1200 for decoding and frame reconstruction.

The bit plane extractor module 1010 will now be described in more detail. In the exemplary embodiment, the bit plane extractor module 1010, executed by the processor 6005, starts the scanning on the most significant bit plane of the frame 1005 and concatenates the most significant bits of the coefficients of the frame 1005, to form a bit-stream containing the most significant bits. In a second pass, the bit plane extractor module 1010 concatenates the second most significant bits of all coefficients of the frame 1005. The bits from the second scanning path are appended to the bit-stream generated in the previous scanning path. The bit plane extractor module 1010 continues the scanning and appending in this manner until the least significant bit plane is completed, so as to generate one bit-stream for each input video frame. The bit-streams generated by the bit plane extractor module 1010 may be stored in the memory and/or the storage device 6009.

In the exemplary embodiment, the bit plane extractor module 1010 scans the frame 1005 in a raster scanning order, visiting each pixel of the frame 1005. In alternative embodiments, the scanning path used by the bit plane extractor module 1010 may be similar to the scanning path employed in JPEG 2000.

In yet another alternative embodiment, the bit plane extractor module 1010 does not visit every pixel of the frame 1005 during scanning. In this instance, the bit plane extractor module 1010 is configured to extract a specified subset of pixels within each bit plane of the frame 1005 to generate parity bits for spatial resolutions lower than the original resolution.

The turbo coder module 1015 is now described in greater detail with reference to FIG. 2 where a schematic block diagram of the turbo coder module 1015 is shown. The turbo coder module 1015 encodes the bit-stream output from the bit plane extractor 1010 according to a bitwise error correction method. The turbo coder module 1015 receives as input bit-stream 2000 from the bit plane extractor 1010. The turbo coder module 1015 may access the input bit-stream 2000 from the memory 6006 and/or the storage device 6009. An interleaver module 2020 of the turbo coder module 1010 interleaves the bit-stream 2000 (the information bit-stream). In the exemplary embodiment, the interleaver module 2020 is a block interleaver. However, in alternative embodiments, any other suitable interleaver may be used. For example, a random or pseudo-random interleaver or a circular-shift interleaver, may be used.

The output from the interleaver module 2020 is an interleaved bit-stream, which is passed on to a recursive systematic coder module 2030 which produces parity bits. One parity bit per input bit is produced. In the exemplary embodiment the recursive systematic coder module 2030 is generated using octal generator polynomials 7 (binary $111_2$) and 5 (binary $101_2$).

A second recursive systematic coder module 2060, executed by the processor 6005, operates directly on the bit-stream 2000 from the bit plane extractor module 1010. In the exemplary embodiment, the recursive systematic coder modules 2030 and 2060 are substantially identical. Both recursive systematic coder modules 2030 and 2060 output a parity bit-stream to a puncturer module 2040, with each parity bit-stream being equal in length to the input bit-stream 2000.

The puncturer module 2040 deterministically deletes parity bits to reduce the parity bit overhead previously generated by the recursive systematic coder modules 2030 and 2060. "Half-rate codes" may be used by the puncturer module 2040, which means that half the parity bits from each recursive systematic encoder module 2030 and 2060 are punctured. In an alternative embodiment the puncturer module 2040 may depend on additional information, such as the bit plane of the current information bit.

In yet another alternative embodiment, the method of reducing the parity bit overhead used by the puncturer module 2040 may depend on the spatial location of a pixel to which the information bit belongs, as well as the frequency content of an area around this pixel.

The turbo coder module 1015 outputs the punctured parity bit-stream 1120, which comprises parity bits produced by recursive systematic coder modules 2060 and 2030.

The turbo decoder module 1260 is now described in detail with reference to FIG. 3 where a schematic block diagram of the turbo decoder module 1260 is shown. The parity bits 3000 in bit-stream 1120 are split into parity bits 3020 originating from the recursive systematic coder module 2030 (see FIG. 2) and parity bits 3040 originating from the recursive systematic coder module 2060 (see FIG. 2).

Parity Bits 3020 are then input to a component decoder module 3060, which preferably uses a Soft Output Viterbi Decoder (SOYA) algorithm. Alternatively, a Max-Log Maximum A Posteriori Probability (MAP) algorithm may be used by the component decoder module 3060. In yet another alternative embodiment, variations of the SOYA or the MAP algorithms are used by the component decoder module 3060.

Systematic bits 3010 from bit plane extractor module 1280 are passed as input to an interleaver module 3050. The interleaver module 3050 is also linked to the component decoder module 3060. In a similar manner, parity bits 3040 are input to a component decoder module 3070, together with the systematic bits 3010.

Figure 3:
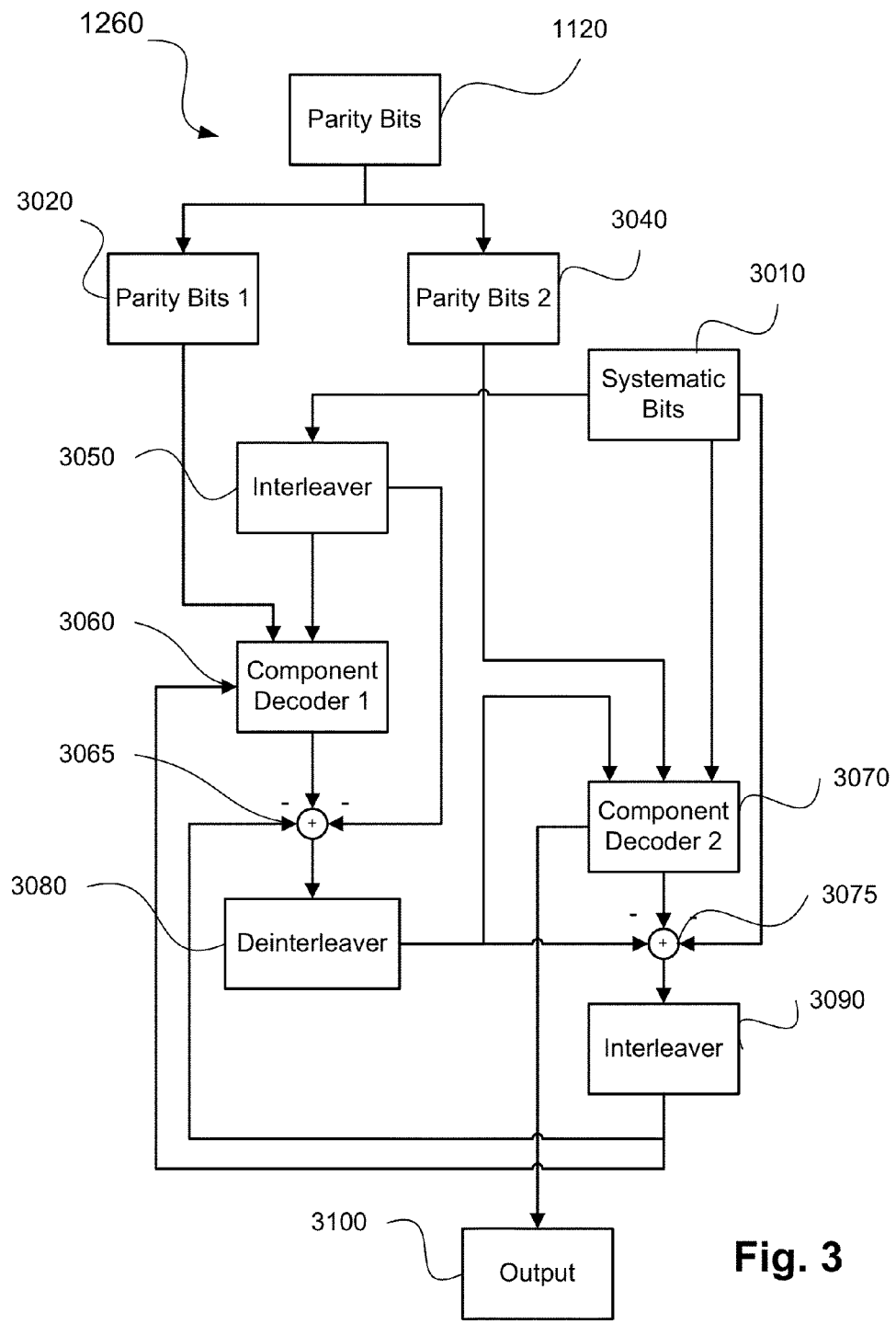
FIG. 3 shows a schematic block diagram of a turbo decoder of the system of FIG. 1.

As can be seen in FIG. 3, the turbo decoder module 1260 comprises a loop formed from the component decoder module 3060, to an adder 3065, to a de-interleaver module 3080, to the component decoder module 3070, to another adder 3075, to interleaver module 3090 and back to component decoder module 3060.

The component decoder module 3060 takes three inputs with the first input being the parity bits 3020. The second input to the component decoder module 3060 are the interleaved systematic bits from the interleaver module 3050. The third input to the component decoder module 3060 are the interleaved systematic bits output from the second component decoder module 3070, modified in adder 3075 and interleaved in the interleaver module 3090. The component decoder module 3070 provides information to the other component decoder module 3060. In particular, the component decoder module 3070 provides information about likely values of the interleaved systematic bits to be decoded. The information provided by the component decoder module 3070 is typically provided in terms of Log Likelihood Ratios $$L(u_k) = \ln\left(\frac{P(u_k = +1)}{P(u_k = -1)}\right),$$

where $P(u_k=+1)$ denotes probability that the bit $u_k$ equals $+1$ and where $P(u_k=-1)$ denotes probability that the bit $u_k$ equals $-1$.

In the first iteration of the turbo decoder module 1260, a feedback input from the second component decoder module 3070 to the first component decoder 3060 does not exist. Therefore, in the first iteration, the feedback input from the second component decoder 3070 is set to zero.

A (decoded) bit-stream produced by component decoder module 3060 is passed on to adder 3065 where "a priori information" related to the bit-stream is produced. Systematic bits are extracted in adder 3065. Information produced by the second component decoder module 3070, processed analogously in adder 3075 and interleaved in interleaver module 3090, is extracted by the adder 3065 as well. Left over is the a priori information which provides the likely value of a bit. The a priori information is valuable for the component decoder 3060.

After adder 3065, a resulting bit-stream is de-interleaved in de-interleaver module 3080, which performs the inverse action of interleaver module 3050. A de-interleaved bit-stream from de-interleaver module 3080 is provided as input to component decoder module 3070. In the exemplary embodiment, the component decoder module 3070 as well as the adder 3075 work analogously to component decoder module 3060 and adder 3065 as described above. A resulting bit-stream output by the adder 3075 is again interleaved in interleaver 3090 and used as input to the first component decoder module 3060 which begins a second iteration of the turbo decoder module 1260.

In the exemplary embodiment, eight iterations between the first component decoder module 3060 and the second component decoder module 3070 are carried out. After completion of eight iterations a resulting bit-stream 3100 produced from component decoder module 3070 (i.e., the turbo decoder 1260) is output. The bit-stream 3100 produced by the component decoder module 3070 may be stored in the memory 6006 and/or the storage device 6009.

The component decoder module 3060 is now described in more detail with reference to FIG. 5.

Figure 5:
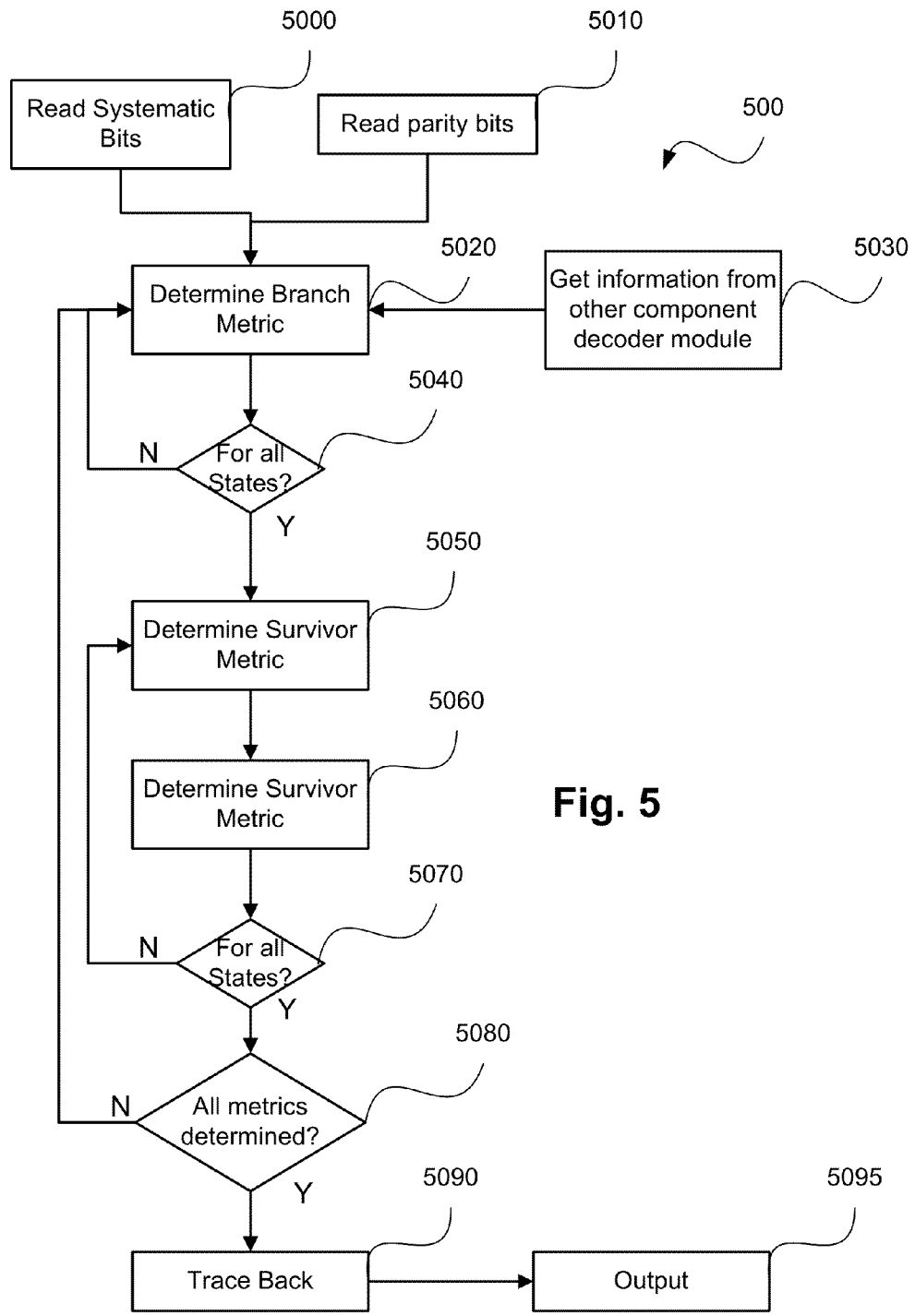
FIG. 5 is a flow diagram showing a decoding method performed in a component decoder of the turbo decoder of FIG. 3.

FIG. 5 is a flow diagram of a decoding method 500 performed by the component decoder module 3060. The component decoder module may be implemented as software resident on the hard disk drive 6010 and is controlled in its execution by the processor 6005.

As described above, in the exemplary embodiment, the two component decoder modules 3060 and 3070 need not be identical. However, in the exemplary embodiment the component decoder modules 3060 and 3070 are substantially identical.

The component decoder module 3060, executed by the processor 6005, commences operation at step 5000 by reading the systematic bits 3010 (see FIG. 3). As noted above, the systematic bits 3010 are output by the up-sampler module 1250 after the up-sampler module 1250 transforms the pixel values to the new binary representation (see FIG. 1).

At step 5010, the parity bits 3020 (FIG. 3) are read by the component decoder module 3060. The parity bits 3020 may be read from the memory 6006 and/or the storage device 6009.

The method 500 continues in step 5020 where the processor 6005 determines a "branch" metric. The branch metric is a measure of decoding quality for a current code word. The branch metric is zero if the decoding of the current code word is error free. The branch metric will be described in further detail below. Code word decoding errors can sometimes not be avoided and can still result in an overall optimal result.

At step 5030, the component decoder module 3060 determines the branch metric by getting information from the other component decoder module 3070 (see FIG. 3). The information is in the form of the log likelihood ratios as already described above. The log likelihood ratios, and as such the determination of the branch metrics, is based on a model of the noise to be expected on the systematic bits 3010. In the exemplary embodiment a Laplace noise model is used by the component decoder module 3060 to compensate for errors in the systematic bits 3010.

The errors (or noise) to be expected on the systematic bits 3010 originates from a JPEG compression and down and up-sampling. Modelling the noise is generally difficult as reconstruction noise is generally signal dependent (e.g. Gibbs phenomenon) and spatially correlated (e.g. JPEG blocking). As such, errors are not independently, identically distributed. Channel coding methods (e.g. turbo codes), assume independent, identically distributed noise.

Even though the magnitude of un-quantized DC coefficients of discrete cosine transform (DCT) coefficients are generally Gaussian distributed, the magnitude of un-quantized AC coefficients may be described by a Laplacian distribution. Quantizing coefficients decreases the standard variation of those Laplacian distributions. As such, noise on DC coefficients may be modelled as Gaussian noise, and noise on AC coefficients may be modelled as Laplace noise. Channel coding methods (e.g. turbo codes), make an assumption that the noise is additive Gaussian white noise. Thus, it is disadvantageous to use unmodified channel coding methods.

As is evident from FIG. 1, the systematic bits 3010 used in the determination of the branch metric in step 5020 originate from a spatial prediction process through the up-sampling performed in the up-sampler module 1250.

Referring again to FIG. 5, at step 5040, the component decoder module 3060, executed by the processor 6005, determines whether all states of a trellis diagram have been processed. If all states have not been processed, then the method 500 returns to step 5020. Otherwise, if the component decoder module 3060 determines at step 5040 that the branch metrics for all states have been determined, then the method 500 continues to step 5050.

At step 5050, the component decoder module 3060, executed by the processor 6005, determines an accumulated branch metric. The accumulated branch metric represents the sum of previous code word decoding errors, which is the sum of previous branch metrics. The accumulated branch metric may be stored in the memory 6006 and/or the storage device 6009.

The method 500 continues at the next step 5060, where the component decoder module 3060 determines "survivor path" metrics. The survivor path metrics represent a lowest overall sum of previous branch metrics, indicating an optimal decoding to date.

At the step 5070, the component decoder module 3060 determines whether all states have been processed. If states remain for processing, then the method 500 performed by the component decoder module 3060 returns to step 5050. Otherwise, the method 500 proceeds to step 5080.

At the next step 5080, if the component decoder module 3060 determines that the determination of the branch metrics, the determination of the accumulated metric and the determination of the survivor path metrics has been completed, then the method 500 proceeds to step 5090. Otherwise, the method 500 returns to step 5020, where the method 500 continues at a next time step in the trellis diagram.

Once the survivor metric is determined for all nodes in the trellis diagram, the component decoder module 3060 determines a trace back at the next step 5090. In particular, at step 5090, the component decoder module 3060 uses a best one of the decoding branch metrics (i.e., indicating the decoding quality) determined in step 5020 to generate a decoded bit-stream. The method 500 concludes at the final step 5095, where the component decoder module 3060 outputs the decoded bit-stream.

The frame reconstruction module 1290 reconstructs the interleaved pixel values from the decoded bit-stream (i.e., 3100) output by the turbo decoder module 1260. In the exemplary embodiment, the most significant bits of the coefficients of the output video frame 1270 are first determined by the turbo decoder module 1260. The second most significant bits of the coefficients of the output video frame 1270 are then determined and concatenated with the first most significant bits. The process performed by the frame reconstruction module 1290 repeats for lower bit planes until all bits are determined for each of the bit planes of the output video frame 1270. The de-interleaver module 1230 performs the inverse operation of the interleaver module 1007 in the encoder 1000 (or the module 1210 in decoder 1200) and outputs the video frame 1270 being a final approximation of the input video frame 1005.

The foregoing describes only some embodiments of the present invention, and modifications and/or changes can be made thereto without departing from the scope and spirit of the invention, the embodiments being illustrative and not restrictive.

For example, instead of processing the same input video frame 1005 in order to produce the bit-streams 1110 and 1120, in an alternative embodiment the bit-stream 1110 is formed from a key frame of the input video, whereas bit-stream 1120 is formed from non-key frames. In such an embodiment the data output from up-sampler module 1250 is then an estimate of the non-key frames. The turbo decoder module 1260 uses the parity data from the bit-stream 1120 to correct the estimate of the non-key frames.

In the context of this specification, the word "comprising" means "including principally but not necessarily solely" or "having" or "including", and not "consisting only of". Variations of the word "comprising", such as "comprise" and "comprises" have correspondingly varied meanings.

The invention claimed is:

1. A method of performing distributed video encoding on an input video frame in a sequence of input video frames, said method comprising:

forming a bit-stream from original pixel values of pixels of the input video frame, such that groups of bits in the bit-stream are associated with clusters of spatial pixel positions of the pixels;

interleaving the bit-stream to reduce spatial correlation between adjacent ones of the pixels;

generating parity bits from the interleaved bit-stream according to a bitwise error correction method, wherein a set of parity bits is generated for each bit-plane of the input video frame;

encoding a first bit-stream containing the generated parity bits; and encoding the input video frame to generate a second encoded bit-stream independently of the first bit-stream, the first and second encoded bit-streams representing one of the input video frames.

2. The method according to claim 1, wherein the parity bits are produced for each bit plane of the input video frame.

3. The method according to claim 1, further comprising the steps of:

down sampling the input video frame; and compressing the down sampled input video frame to form the second encoded bit-stream.

4. A method of decoding a compressed video frame, said method comprising the steps of:
- decompressing the compressed video frame;
- interleaving the decompressed video frame to determine an interleaved video frame formed to reduce spatial correlation between adjacent ones of the pixels of the decompressed video frame;
- receiving parity bits generated from an interleaved bit-stream of the interleaved video frame, the parity bits being generated according to a bit-wise error correction method independently of the interleaved video frame, wherein a set of parity bits is generated for each bit-plane of the video frame; and
- de-interleaving pixel values of the pixels of the interleaved video frame based on the generated parity bits to determine a decoded version of the compressed video frame.

5. The method according to claim 4, further comprising the step of determining an approximation of the compressed video frame.

6. An apparatus for performing distributed video encoding on an input video frame in a sequence of input video frames, said apparatus comprising:
- forming means for forming a bit-stream from original pixel values of pixels of the input video frame, such that groups of bits in the bit-stream are associated with clusters of spatial pixel positions of the pixels;
- an interleaver for interleaving the bit-stream to reduce spatial correlation between adjacent ones of the pixels; and
- an encoder for encoding a first bit-stream containing parity bits generated from the interleaved bit-stream according to a bitwise error correction method, a set of parity bits being generated for each bit-plane of the input video frame, wherein the encoder encodes the input video frame to generate a second encoded bit-stream independently of the first bit-stream, the first and second encoded bit-streams representing one of the input video frames.

7. An apparatus for decoding a compressed video frame, said apparatus comprising:
- a decompressor for decompressing the compressed video frame;
- an interleaver for interleaving the decompressed video frame to determine an interleaved video frame formed to reduce spatial correlation between adjacent ones of the pixels of the decompressed video frame;
- a decoder for receiving parity bits generated from an interleaved bit-stream of the interleaved video frame, the parity being generated according to a bit-wise error correction method independently of the interleaved video frame, wherein a set of parity bits is generated for each bit-plane of the video frame; and
- a de-interleaver for de-interleaving pixel values of the pixels of the interleaved video frame based on the generated parity bits to determine a decoded version of the compressed video frame.

8. A non-transitory computer readable medium having a computer program recorded therein for performing distributed video encoding on an input video frame in a sequence of input video frames, said computer program comprising:
- code for forming a bit-stream from original pixel values of pixels of the input video frame, such that groups of bits in the bit-stream are associated with clusters of spatial pixel positions of the pixels;
- code for interleaving the bit-stream to reduce spatial correlation between adjacent ones of the pixels;
- code for generating parity bits from the interleaved bit-stream according to a bitwise error correction method, wherein a set of parity bits is generated for each bit-plane of the input video frame;
- code for encoding a first bit-stream containing the generated parity bits g; and
- code for encoding the input video frame to generate a second encoded bit-stream independently of the first bit-stream, the first and second encoded bit-streams representing one of the input video frames.

9. A non-transitory computer readable medium having a computer program recorded therein for decoding a compressed video frame, said program comprising:
- code for decompressing the compressed video frame;
- code for interleaving the decompressed video frame to determine an interleaved video frame formed to reduce spatial correlation between adjacent ones of the pixels of the decompressed video frame;
- code for receiving parity bits generated from an interleaved bit-stream of the interleaved video frame, the parity bits being generated according to a bit-wise error correction method independently of the interleaved video frame, wherein a set of parity bits is generated for each bit-plane of the video frame; and
- code for de-interleaving pixel values of the pixels of the interleaved video frame based on the generated parity bits to determine a decoded version of the compressed video frame.

10. A system for performing distributed video encoding on an input video frame in a sequence of input video frames, said system comprising:
- a memory for storing data and a computer program; and
- a processor coupled to said memory executing said computer program, said computer program comprising instructions for:
  - forming a bit-stream from original pixel values of pixels of the input video frame, such that groups of bits in the bit-stream are associated with clusters of spatial pixel positions of the pixels;
  - interleaving the bit-stream to reduce spatial correlation between adjacent ones of the pixels;
  - generating parity bits from the interleaved bit-stream according to a bitwise error correction method, wherein a set of parity bits is generated for each bit-plane of the input video frame;
  - encoding a first bit-stream containing the generated parity bits; and
  - code for encoding the input video frame to generate a second encoded bit-stream independently of the first bit-stream, the first and second encoded bit-streams representing one of the input video frames.

11. A system for decoding a compressed video frame, said system comprising:
- a memory for storing data and a computer program; and
- a processor coupled to said memory executing said computer program, said computer program comprising instructions for:
  - decompressing the compressed video frame;
  - interleaving the decompressed video frame to determine an interleaved video frame formed to reduce spatial correlation between adjacent ones of the pixels of the decompressed video frame;
  - receiving parity bits generated from an interleaved bit-stream of the interleaved video frame, the parity bits being generated according to a bit-wise error correction method independently of the interleaved video frame, wherein a set of parity bits is generated for each bit-plane of the video frame; and de-interleaving pixel values of the pixels of the interleaved video frame based on the generated parity bits to determine a decoded version of the compressed video frame.

* * * * *